(12) United States Patent
Kishida et al.

(10) Patent No.: US 8,766,260 B2
(45) Date of Patent: Jul. 1, 2014

(54) THIN-FILM TRANSISTOR AND METHOD FOR MANUFACTURING THIN-FILM TRANSISTOR

(75) Inventors: Yuji Kishida, Hyogo (JP); Takahiro Kawashima, Osaka (JP); Arinobu Kanegae, Kyoto (JP); Genshirou Kawashi, Chiba (JP)

(73) Assignees: Panasonic Corporation, Osaka (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 13/606,928

(22) Filed: Sep. 7, 2012

(65) Prior Publication Data

US 2013/0001559 A1 Jan. 3, 2013

Related U.S. Application Data

(63) Continuation of application No. PCT/JP2011/003471, filed on Jun. 17, 2011.

(51) Int. Cl.
*H01L 29/04* (2006.01)

(52) U.S. Cl.
USPC .......................................................... 257/57

(58) Field of Classification Search
USPC ............. 257/57, E29.291, E21.412, E51.005, 257/E29.151; 438/158, 149, 482
See application file for complete search history.

(56) References Cited

U.S. PATENT DOCUMENTS

| | | | |
|---|---|---|---|
| 6,356,031 B1 * | 3/2002 | Thagard et al. ............ | 315/169.3 |
| 7,145,176 B2 | 12/2006 | Kawasaki et al. | |
| 7,199,027 B2 | 4/2007 | Ichijo et al. | |
| 7,768,009 B2 | 8/2010 | Kobayashi et al. | |
| 7,994,502 B2 | 8/2011 | Yamazaki et al. | |
| 8,133,771 B2 | 3/2012 | Kobayashi et al. | |
| 8,278,665 B2 | 10/2012 | Asanuma et al. | |
| 2002/0145143 A1 | 10/2002 | Kawasaki et al. | |
| 2004/0224486 A1 | 11/2004 | Ichijo et al. | |
| 2009/0057672 A1 | 3/2009 | Kobayashi et al. | |
| 2009/0140250 A1 | 6/2009 | Yamazaki et al. | |
| 2010/0285624 A1 | 11/2010 | Kobayashi et al. | |

(Continued)

FOREIGN PATENT DOCUMENTS

| | | |
|---|---|---|
| JP | 06-120505 | 4/1994 |
| JP | 08-247979 | 9/1996 |

(Continued)

OTHER PUBLICATIONS

U.S. Appl. No. 13/632,607 to Yuji Kishida et al., filed Oct. 1, 2012.

(Continued)

*Primary Examiner* — Jarrett Stark
*Assistant Examiner* — Shahed Ahmed
(74) *Attorney, Agent, or Firm* — Greenblum & Bernstein, P.L.C.

(57) ABSTRACT

A substrate; a gate electrode formed above the substrate; a gate insulating film formed above the gate electrode; a crystalline silicon semiconductor layer formed above the gate insulating film; an amorphous silicon semiconductor layer formed above the crystalline silicon semiconductor layer; an organic protective film made of an organic material and formed above the amorphous silicon semiconductor layer; and a source electrode and a drain electrode formed above the amorphous silicon semiconductor layer interposing the organic protective film are included, and a charge density of the negative carriers in the amorphous silicon semiconductor layer is at least $3 \times 10^{11}$ cm$^{-2}$.

12 Claims, 7 Drawing Sheets

(56) References Cited

U.S. PATENT DOCUMENTS

| | | |
|---|---|---|
| 2011/0062342 A1* | 3/2011 | Lee et al. .............. 250/370.09 |
| 2011/0073863 A1 | 3/2011 | Asanuma et al. |
| 2011/0284856 A1 | 11/2011 | Yamazaki et al. |
| 2012/0129288 A1 | 5/2012 | Kobayashi et al. |

FOREIGN PATENT DOCUMENTS

| | | |
|---|---|---|
| JP | 09-283761 | 10/1997 |
| JP | 10-270701 | 10/1998 |
| JP | 2002-305306 | 10/2002 |
| JP | 2003-173970 | 6/2003 |
| JP | 2007-005508 | 1/2007 |
| JP | 2009-076894 | 4/2009 |
| JP | 2009151328 A * | 7/2009 |
| JP | 2009-177138 | 8/2009 |
| JP | 2011-071440 | 4/2011 |
| JP | 2011071440 A * | 4/2011 |

OTHER PUBLICATIONS

International Search Report in International Application No. PCT/JP2011/003471, dated Jul. 19, 2011.

* cited by examiner (Comparative example)

(Present disclosure: Thickness of amorphous semiconductor = 10 nm)

(Present disclosure: Thickness of amorphous semiconductor = 20 nm)

Drain current (a.u.)

Gate voltage (a.u.)

THIN-FILM TRANSISTOR AND METHOD FOR MANUFACTURING THIN-FILM TRANSISTOR

CROSS REFERENCE TO RELATED APPLICATION

This is a continuation application of PCT Patent Application No. PCT/JP2011/003471 filed on Jun. 17, 2011, designating the United States of America. The entire disclosure of the above-identified application, including the specification, drawings and claims is incorporated herein by reference in their entirety.

TECHNICAL FIELD

One or more exemplary embodiments disclosed herein relate generally to thin-film transistors and methods for manufacturing the thin-film transistors, and particularly to a channel protective thin-film transistor and a method for manufacturing the channel protective thin-film transistor.

BACKGROUND ART

In recent years, organic EL displays using electroluminescence (EL) of an organic material have been attracting attention as a type of next-generation flat panel display replacing liquid crystal displays. In an active-matrix display device such as the organic EL display, a thin-film semiconductor device referred to as a thin-film transistor (TFT) is used.

Unlike the voltage-driven liquid crystal display, the organic EL display is a current-driven display device. Accordingly, there is an urgent need for development of a thin-film transistor having excellent turn-on/off characteristics as a driving circuit for the active-matrix display device. The thin-film transistor includes a gate electrode, a semiconductor layer (channel layer), a source electrode, and a drain electrode formed above a substrate. Generally, a silicon thin-film is used as the channel layer.

Increased size and reduced cost are also required for the display device, and a bottom-gate thin-film transistor in which a gate electrode is formed on a side close to the substrate with respect to the channel layer is generally used as a thin-film transistor which allows cost reduction easily.

The bottom-gate thin-film transistor is generally divided into two types; namely, a channel etching thin-film transistor which includes an etched channel layer, and a channel protective (etching-stopper) thin-film transistor in which the channel layer is protected from etching.

Compared to the channel protective thin-film transistor, the channel etching thin-film transistor has advantages in the reduced number of photolithography process and a lower cost.

In contrast, with the channel protective thin-film transistor, it is possible to prevent the damage on the channel layer by etching, suppressing an increase in the variation of characteristics within a surface of the substrate. Furthermore, the channel layer of the channel protective thin-film transistor can be thinner than the channel layer of the channel etching thin-film transistor. Accordingly, parasitic resistance component can be reduced and the turn-on characteristics can be improved, which are advantageous for increasing definition.

Therefore, the channel protective thin-film transistor is suitable for a driving transistor in the current-driven organic EL display device using an organic EL element, for example, and there are attempts to use the channel protective thin-film transistor as a pixel circuit in the organic EL display device even if the manufacturing cost is higher than the manufacturing cost when the channel-etching thin-film transistor is used.

For example, the patent literature 1 discloses a channel protective TFT in which a microcrystalline semiconductor film is used as a channel layer, and a channel protective layer is formed above a channel layer with a buffer layer provided in between.

CITATION LIST

Patent Literature

[Patent Literature 1] Japanese Unexamined Patent Application Publication No. 2009-76894

SUMMARY

Technical Problem

However, in the channel-protective thin-film transistor, a subthreshold swing value indicating the characteristics of the thin-film transistor is deteriorated when the channel protective layer is formed by applying the organic material.

Variation in rising regions of the subthreshold swing values is particularly large. The rising region of the subthreshold swing value corresponds to a region in which the light emitted from the display device is low in tone, that is, a black light-emission region. Unlike the liquid crystal display, the characteristics in the black light-emission region are important for the organic EL display.

As described above, there is a problem in the thin-film transistor having the channel protective layer formed by applying the organic material is that the subthreshold swing value is deteriorated.

One non-limiting and exemplary embodiment provides a channel-protective thin-film transistor with excellent subthreshold swing value, having the organic protective film as a channel protective layer and a method for manufacturing the thin-film transistor.

Solution to Problem

In one general aspect, an aspect of the thin-film transistor disclosed here feature includes: a substrate; a gate electrode formed above the substrate; a gate insulating film formed above the gate electrode; a crystalline silicon semiconductor layer formed above the gate insulating film; an amorphous silicon semiconductor layer formed above the crystalline silicon semiconductor layer; an organic protective film made of an organic material and formed above the amorphous silicon semiconductor layer; and a source electrode and a drain electrode formed above the amorphous silicon semiconductor layer interposing the organic protective film, in which a thickness of the amorphous silicon semiconductor layer is at least 10 nm and at most 60 nm, a charge density of the amorphous silicon semiconductor layer measured by a transition voltage spectroscopy (TVS) is at least $1 \times 10^{17}$ cm$^{-3}$ and at most $7 \times 10^{17}$ cm$^{-3}$.

Advantageous Effects

One or more exemplary embodiments or features disclosed herein provide a thin-film transistor having excellent transistor characteristics, particularly excellent subthreshold swing value.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENT

Figure 1:
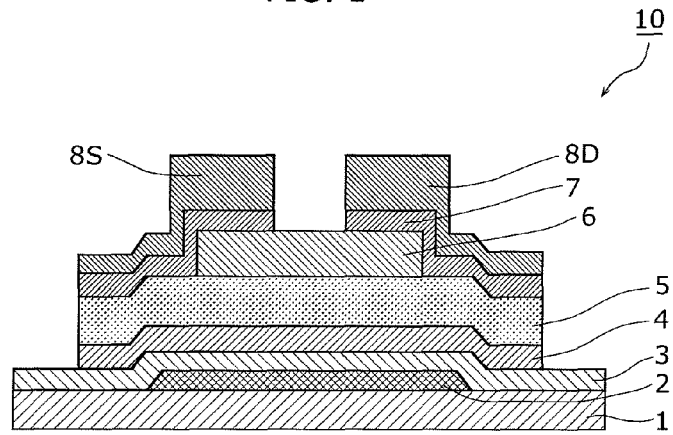
FIG. 1 is a cross-sectional view schematically illustrating configuration of a thin-film transistor according to an exemplary embodiment.

The thin-film transistor according to an aspect of the present disclosure includes: a substrate; a gate electrode formed above the substrate; a gate insulating film formed above the gate electrode; a crystalline silicon semiconductor layer formed above the gate insulating film; an amorphous silicon semiconductor layer formed above the crystalline silicon semiconductor layer; an organic protective film made of an organic material and formed above the amorphous silicon semiconductor layer; and a source electrode and a drain electrode formed above the amorphous silicon semiconductor layer interposing the organic protective film, in which a thickness of the amorphous silicon semiconductor layer is at least 10 nm and at most 60 nm, a charge density of the amorphous silicon semiconductor layer measured by a transition voltage spectroscopy (TVS) is at least $1 \times 10^{17}$ cm$^{-3}$ and at most $7 \times 10^{17}$ cm$^{-3}$.

With this, it is possible to shield electric field by cancelling the positive fixed charge in the organic protective film by the fixed charge of the negative carrier trapped by a trap level (traps caused by crystal defect, structural traps, and others) in the amorphous silicon semiconductor layer, and to suppress the formation of the back channel when the transistor is turned, thereby improving the subthreshold swing values.

Furthermore, in an aspect of the thin-film transistor according to the present disclosure, it is preferable that a thickness of the organic protective film in a region overlapping with the source electrode or the drain electrode is at least 300 nm and at most 1 μm. Furthermore, in an aspect of the thin-film transistor according to the present disclosure, it is preferable that a thickness of the organic protective film in a region overlapping with the source electrode or the drain electrode is at least 500 nm and at most 1 μm.

With this structure, it is possible to cancelling the positive fixed charge generated in the organic protective film by the amorphous silicon semiconductor layer having the charge density of the negative carriers at least $3 \times 10^{11}$ cm$^{-2}$.

Furthermore, in an aspect of the thin-film transistor according to the present disclosure, a polarity of a total charge of a fixed charge included in the organic protective film and charge at an interface between the organic protective film and the amorphous silicon semiconductor layer is positive.

Furthermore, in an aspect of the thin-film transistor according to the present disclosure, the thickness of the amorphous silicon semiconductor layer is at least 20 nm and at most 40 nm, and the charge density of the amorphous silicon semiconductor layer is at least $1 \times 10^{17}$ cm$^{-3}$ and at most $5 \times 10^{17}$ cm$^{-3}$.

With this structure, it is possible to form the amorphous silicon semiconductor layer having the charge density of the negative carriers at least $3 \times 10^{11}$ cm$^{-2}$.

A method for manufacturing a thin-film transistor according to an aspect of the present disclosure includes preparing a substrate; forming a gate electrode above the substrate; forming a gate insulating film above the gate electrode; forming a crystalline silicon semiconductor layer above the gate insulating film; forming an amorphous silicon semiconductor layer above the crystalline silicon semiconductor layer; forming, an organic protective film by applying an organic material on the amorphous silicon semiconductor layer; and forming a source electrode and a drain electrode above the amorphous silicon semiconductor layer interposing the organic protective film, wherein a thickness of the amorphous silicon semiconductor layer is at least 10 nm and at most 60 nm, and a charge density of the amorphous silicon semiconductor layer measured by the TVS is at least $1\times10^{17}$ cm$^{-3}$ and at most $7\times10^{17}$ cm$^{-3}$.

With this method, it is possible to manufacture the thin-film transistor capable of improving the subthreshold swing values by cancelling the positive fixed charge in the organic protective film by the negative carriers in the amorphous silicon semiconductor layer.

Furthermore, in an aspect of the thin-film transistor according to the present disclosure, it is preferable that the amorphous silicon semiconductor layer is formed using a source gas including one of silane gas, disilane gas, and trisilane gas, and an inert gas including one of argon, hydrogen, and helium, under a condition in which a plasma density is 0.1 W/cm$^2$ to 1 W/cm$^2$. Furthermore, in an aspect of the thin-film transistor according to the present disclosure, it is preferable that the amorphous silicon semiconductor layer is formed under a condition in which a growth temperature is 300° C. to 400° C.

With this, it is possible to form the amorphous silicon semiconductor layer having a desired trap density and the charge density of the negative carriers at least $3\times10^{11}$ cm$^{-2}$.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of appended Claims and their equivalents. Therefore, among the structural elements in the following exemplary embodiments, structural elements not recited in any one of the independent claims are described as arbitrary structural elements.

Embodiment

The following shall describe a thin-film transistor and a method for manufacturing the thin-film transistor according to an embodiment with reference to the drawings.

First, the configuration of a thin-film transistor 10 according to the exemplary embodiment shall be described with reference to FIG. 1. FIG. 1 is a cross-sectional view schematically illustrating the configuration of the thin-film transistor according to this embodiment.

As illustrated in FIG. 1, the thin-film transistor 10 according to this embodiment is a channel protective bottom-gate thin-film transistor, and includes: a substrate 1; a gate electrode 2 formed above the substrate 1; a gate insulating film 3 formed above the gate electrode 2; a crystalline silicon semiconductor layer 4 formed above the gate insulating film 3; an amorphous silicon semiconductor layer 5 formed above the crystalline silicon semiconductor layer 4; an organic protective film 6 made of an organic material and formed above the amorphous silicon semiconductor layer 5; and a source electrode 8S and a drain electrode 8D formed above the amorphous silicon semiconductor layer 5 interposing the organic protective film 6. Furthermore, the thin-film transistor 10 according to this embodiment includes a pair of contact layers 7 above the crystalline silicon semiconductor layer 4 between (i) the amorphous silicon semiconductor layer 5 and (ii) the source electrode 8S or the drain electrode 8D.

The following shall specifically describe elements of the thin-film transistor 10 according to this embodiment.

The substrate 1 is a glass substrate made of, for example, a glass material such as silica glass, alkali-free glass, or highly heat-resistant glass. An undercoat layer made of a silicon nitride (SiN$_x$) film, a silicon oxide (SiO$_y$) film, a silicon oxynitride (SiO$_y$N$_x$) film, or others may be formed on the substrate 1 in order to prevent impurity such as sodium and phosphorus in the glass substrate from entering the crystalline silicon semiconductor layer 4. In addition, the undercoat layer also functions as a layer for buffering the heat on the substrate 1 in a high-temperature thermal treatment process such as laser annealing. The thickness of the undercoat layer is, for example, approximately 100 nm to 2000 nm.

The gate electrode 2 is patterned on the substrate 1 in a predetermined shape, and is made of single-layer structure or a multi-layer structure of molybdenum (Mo), aluminum (Al), copper (Cu), tungsten (W), titanium (Ti), and chromium (Cr), and molybdenum-tungsten (MoW), for example. The thickness of the gate electrode 2 is, for example, approximately 20 nm to 500 nm.

The gate insulating film 3 is made of, for example, silicon oxide (SiO$_y$), silicon nitride (SiN$_x$), a silicon oxynitride (SiO$_y$N$_x$) film, aluminum oxide (AlO$_z$), or tantalum oxide (TaO$_w$), or a stacked film of the materials, and is formed on the substrate 1 and the gate electrode 2 so as to cover the substrate 1 on which the gate electrode 2 is formed.

In this embodiment, the crystalline silicon semiconductor layer 4 is used as the channel layer. Accordingly, silicon oxide is used as the gate insulating film 3, for example. The reason is that it is preferable to have good interface state between the crystalline silicon semiconductor layer 4 and the gate insulating film 3 for maintaining excellent threshold voltage characteristics of the TFT, and silicon oxide is suitable for this purpose. The thickness of the gate insulating film 3 is 50 nm to 300 nm, for example.

The crystalline silicon semiconductor layer 4 is a channel layer having a channel region in which movement of carriers are controlled by the voltage at the gate electrode 2. In this embodiment, the crystalline silicon semiconductor layer 4 may be formed by crystallizing amorphous silicon.

The crystalline silicon semiconductor layer 4 may be formed as crystalline silicon made of microcrystalline silicon and polycrystalline silicon, or as a mixed crystal structure of amorphous silicon and crystalline silicon. In this case, in order to achieve excellent turn-on characteristics, at least the channel region of the crystalline silicon semiconductor layer 4 is formed of a film having a high ratio of crystalline silicon, for example. The grain size of the crystalline silicon in the crystalline silicon semiconductor layer 4 is, for example, approximately 5 nm to 1000 nm. Note that, the thickness of the crystalline silicon semiconductor layer 4 is, for example, approximately 10 nm to 90 nm.

The amorphous silicon semiconductor layer 5 is a charge suppressing layer for suppressing positive fixed charge contained in the organic protective film 6. The amorphous silicon semiconductor layer 5 in this embodiment is made of an amorphous silicon film, and includes negative carriers having charge density at least $3\times10^{11}$ cm$^{-2}$. Note that, the thickness of the amorphous silicon semiconductor layer 5 may be 10 nm to 60 nm.

The organic protective film 6 is a channel protective film for protecting the channel layer, and is formed on the amorphous silicon semiconductor layer 5. In this embodiment, the organic protective film 6 functions as a channel etching stopper (CES) layer for preventing the channel layer from being etched during the etching process for forming the pair of the contact layer 7. To put it differently, during the etching process for patterning the contact layer 7, the upper part of the organic protective film 6 is etched (not illustrated). Here, the thickness of the organic protective film 6 in the region overlapping with the source electrode 8S or the drain electrode 8D (the part not etched by the channel etching) is, for example, 300 nm to 1 μm. Furthermore, the thickness is preferably at least 500 nm and at most 1 μm. The organic protective film 6 having the thickness in this range can cancel the positive fixed charge in the organic protective film 6 by the amorphous silicon semiconductor layer 5 having the charge density of negative carriers at least $3\times10^{11}$ cm$^{-2}$.

The organic protective film 6 is made of an organic material, and is formed by applying polysiloxane in this embodiment. Polysiloxane has silica bonding as a main chain to which organic components having carbon such as methyl are combined. Note that, the organic protective film 6 may be formed by applying an organic material by the spin coating or others. Other than the coating method such as the spin coating, the organic protective film 6 may be formed by a droplet ejection method or a printing method such as the screen printing or the offset printing which allows forming the predetermined pattern.

The pair of contact layer 7 is formed of an amorphous semiconductor layer containing high concentration impurity or a polycrystalline semiconductor layer containing high concentration impurity, and is formed on the amorphous silicon semiconductor layer 5. The pair of contact layers 7 is provided opposite to each other at a predetermined distance on the organic protective film 6. In this embodiment, the pair of the contact layers 7 may be n-type semiconductor layers formed by doping phosphorous (P) in the amorphous silicon as the impurity, and may be an n$^+$ layer including a high concentration of impurity of at least $1\times10^{19}$ (atm/cm$^3$) or above. The thickness of each of the contact layers 7 may be 5 nm to 100 nm, for example.

A pair of the source electrode 8S and the drain electrode 8D are provided on the pair of contact layers 7, flush with the pair of the contact layer 7, and opposite to each other at a predetermined distance. In this embodiment, each of the source electrode 8S and the drain electrode 8D may be a single-layer structure or multilayer structure that is made of a conductive material, an alloy, or the like, and is made of, for example, aluminum (Al), molybdenum (Mo), tungsten (W), copper (Cu), titanium (Ti), and chromium (Cr). The source electrode 8S and the drain electrode 8D may be a try-layer structure of MoW/Al/MoW, for example. Note that, the thickness of the source electrode 8S and the drain electrode 8D may be, for example, approximately 100 nm to 500 nm.

Figure 2:
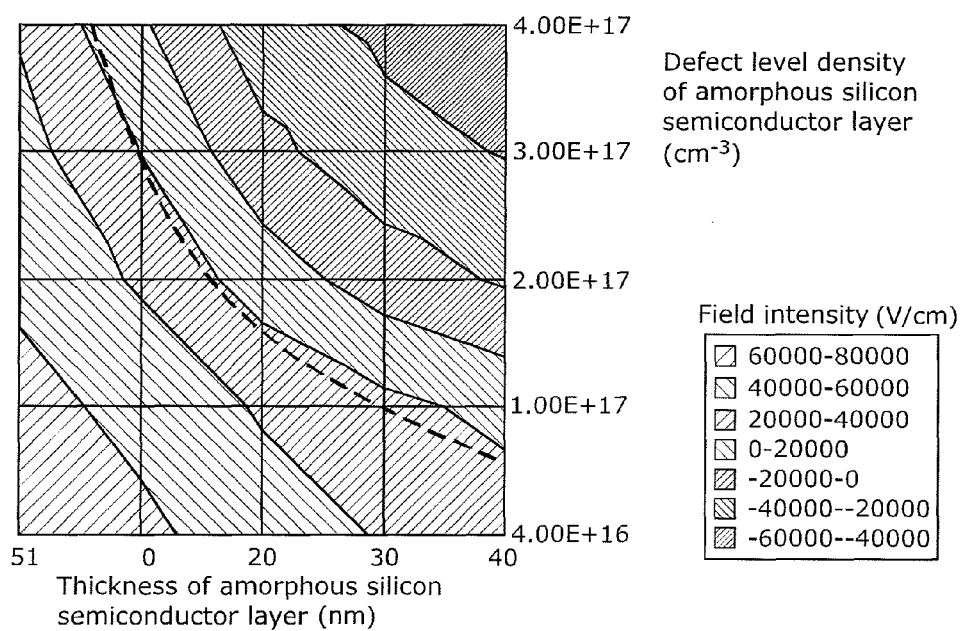
FIG. 2 illustrates a relationship between an electric field at an interface between an amorphous silicon semiconductor layer and a crystalline silicon semiconductor layer, and a thickness and a density of state of the amorphous silicon semiconductor layer in the thin-film transistor according to the embodiment.

As described above, in the thin-film transistor 10 according to this embodiment, the amorphous silicon semiconductor layer 5 is configured to include negative carriers with a charge density at least $3\times10^{11}$ cm$^{-2}$. The charge density of the negative carriers in the amorphous silicon semiconductor layer 5 shall be described with reference to FIG. 2. FIG. 2 illustrates a relationship between the electric field at the interface between the amorphous silicon semiconductor layer and the crystalline silicon semiconductor layer, thickness and density of state (DOS) of the amorphous silicon semiconductor layer, in the thin-film transistor according to this embodiment.

The defect level density (trap density) in the vertical axis of FIG. 2 represents the DOS, which changes along with the change in the film quality of the amorphous silicon semiconductor layer 5. The DOS can be calculated by the method for measuring the defect level referred to as the transient voltage spectroscopy (TVS) disclosed in the Japanese Unexamined Patent Application Publication No. H08-247979. The TVS is the method of calculating the DOS in a bandgap in the semiconductor by using a signal detected when detecting temporal change in a retention rate of voltage between terminals of a capacitor including a stacked material of metal, an insulating film, and a semiconductor. By using the TVS, carriers trapped by the trap level present in the bandgap of the semiconductor can be temporarily calculated as the fixed charge density.

In the thin-film transistor 10 according to this embodiment, the DOS of the amorphous silicon semiconductor layer 5 is measured using the TVS. More specifically, a predetermined voltage is applied to the gate electrode 2 and the source electrode 8S in different times, and the temporal change in the voltage at the gate electrode 2 and the source electrode 8S is calculated. The DOS can be calculated based on the temporal change. The DOS of the amorphous silicon semiconductor layer 5 having a thickness of 20 nm formed in this embodiment was actually measured, and was $4.68\times10^{17}$ cm$^{-3}$. Note that, the amorphous silicon semiconductor layer 5 is formed by using SiH$_4$ and H$_2$ as a source gas, and is formed under a condition in which the growth temperature is 320° C., the pressure is 2 Torr, plasma density is 0.137 W/cm$^{-2}$, and a flow rate of the gas of SiH$_4$ and H$_2$ are 10 sccm and 60 sccm, respectively.

Here, if the positive fixed charge density in the organic protective film 6 is at least $5\times10^{11}$ cm$^{-2}$, a parasitic current caused by a back channel is generated. As illustrated in the broken line in FIG. 2, if the charge density of the negative carriers included in the amorphous silicon semiconductor layer 5 is at least $3\times10^{11}$ cm$^{-2}$, the positive charge is cancelled.

More specifically, as opposed to the positive fixed charge present in the organic protective film 6, the amorphous silicon semiconductor layer 5 having negative carriers with the charge density at least $3\times10^{11}$ cm$^{-2}$ is formed. With this, the amorphous silicon semiconductor layer 5 can function as the charge suppressing layer, suppressing the formation of the back channel. With this, the subthreshold swing value which is one of the characteristics of the thin-film transistor can be improved.

Note that, as illustrated in FIG. 2, the charge density of the amorphous silicon semiconductor layer 5 is determined as a product of the thickness of the amorphous silicon semiconductor layer 5 and the DOS of the charge. For example, in the case of the amorphous silicon semiconductor layer 5 having the film quality including the thickness of 20 nm and the DOS of $2.00\times10^{17}$ cm$^{-3}$, the charge density of the negative carrier in the amorphous silicon semiconductor layer 5 is (20 nm)×$(2.00\times10^{17}$ cm$^{-3})=4.0\times10^{11}$ cm$^{-2}$.

As described above, the charge density of the amorphous silicon semiconductor layer is determined as the product of the thickness and the DOS of the charge. If the thickness of the amorphous silicon semiconductor layer is too large, the turn-on characteristics are deteriorated; in contrast, if the DOS is too large, this could cause a leakage current. Accordingly, the thickness and the DOS of the amorphous silicon semiconductor layer are set in a desired range as illustrated in FIG. 2, for example.

For example, if the thickness of the amorphous silicon layer 5 is at least 10 nm and at most 60 nm, the DOS of the amorphous silicon semiconductor layer 5 measured by the TVS is preferably at least $1\times10^{17}$ cm$^{-3}$ and at most $7\times10^{17}$ cm$^{-3}$. With this, the charge density of the negative carrier included in the amorphous silicon semiconductor layer 5 is set to be at least $3\times10^{11}$ cm$^{-2}$, which allows cancelling the positive fixed charge included in the organic protective film 6 having the thickness of 300 nm to 1 μm.

Furthermore, if the thickness of the amorphous silicon semiconductor layer 5 is at least 20 nm and at most 40 nm, the DOS of the amorphous silicon semiconductor layer 5 measured by the TVS is preferably at least $1 \times 10^{17}$ cm$^{-3}$ and at most $5 \times 10^{17}$ cm$^{-3}$.

Figure 3A:
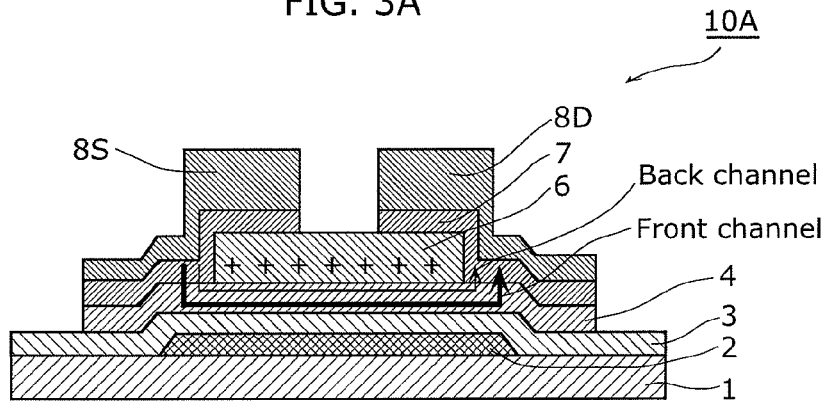
FIG. 3A is a cross-sectional view illustrating configuration and action of a thin-film transistor according to a comparative example.
Figure 3B:
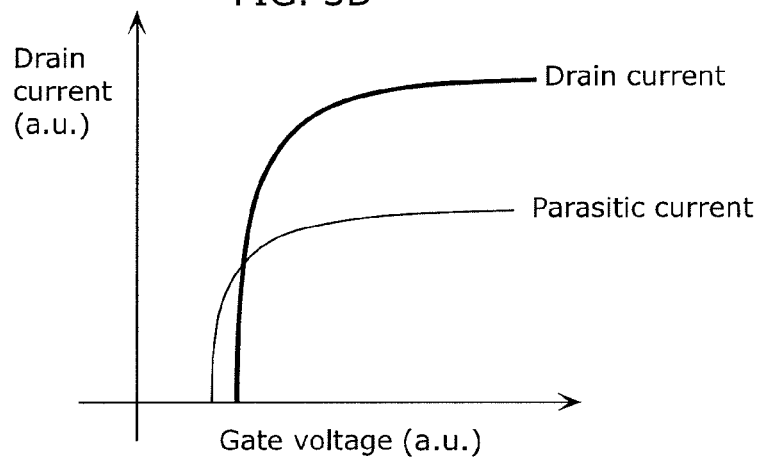
FIG. 3B illustrates current-voltage characteristics of the thin-film transistor according to a comparative example.
Figure 4A:
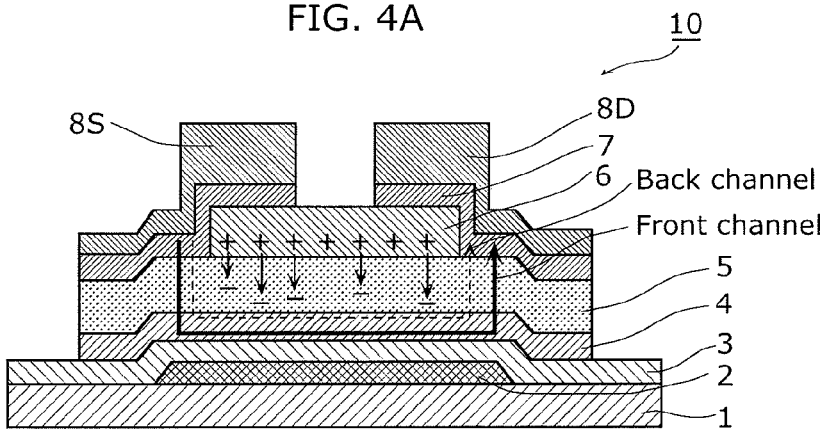
FIG. 4A is a cross-sectional view illustrating configuration and action of a thin-film transistor according to the comparative example.
Figure 4B:
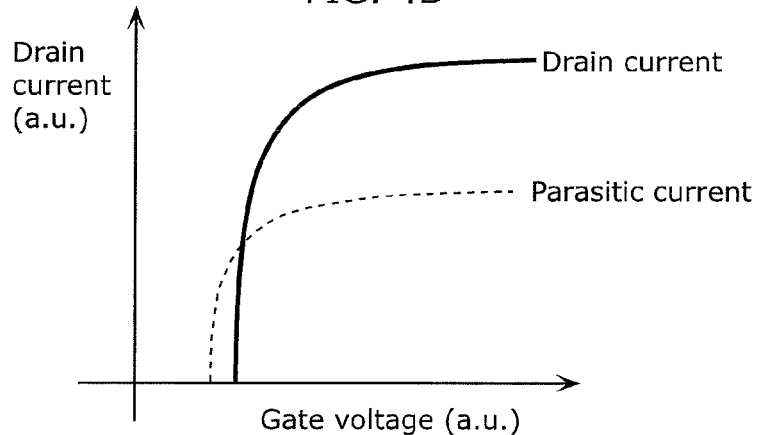
FIG. 4B illustrates current-voltage characteristics of the thin-film transistor according to the exemplary embodiment.

Next, the action of the thin-film transistor according to this embodiment shall be described in more detail with reference to FIG. 3A, FIG. 3B, FIG. 4A, and FIG. 4B. FIG. 3A is a cross-sectional view illustrating the configuration and the action of the thin-film transistor according to a comparative example. FIG. 3B illustrates the current-voltage characteristics of the thin-film transistor according to the comparative example. FIG. 4A is a cross-sectional view illustrating the configuration and the action of the thin-film transistor according to this embodiment. FIG. 4B illustrates the current-voltage characteristics of the thin-film transistor according to this embodiment. Note that, in FIG. 3A, the same reference numerals as the components illustrated in FIG. 1 are assigned to the components identical to the components in FIG. 1.

As illustrated in FIG. 3A, a thin-film transistor 10A according to the comparative example is different from the thin-film transistor 10 according to this embodiment in that the amorphous silicon semiconductor layer 5 is not formed. The current-voltage characteristics of the thin-film transistor 10A according to the comparative example were measured. The result shows, as described above, the subthreshold swing value was deteriorated, and particularly, variation was observed in rising regions of the subthreshold swing values.

After diligent analysis and consideration on the cause of the deterioration in the subthreshold swing value, the inventors found out that the cause is as follows: when an organic material is used as the channel protective layer, a large amount of positive fixed charge is included in the channel protective layer, which forms a back channel in the channel layer when the turn-on current flows, causing the deterioration in the subthreshold swing value.

The front channel is a path of the turn-on current (drain current) flowing from the source electrode to the drain electrode via a vicinity of an interface toward the gate electrode in the channel layer. In contrast, the back channel is a path of parasitic current flowing from the source electrode to the drain electrode via a vicinity of an interface with the channel protective layer in the channel layer.

In the thin-film transistor 10A according to the comparative example, the positive fixed charge is included in the organic protective film 6 (or the interface between the organic protective film 6 and the crystalline silicon semiconductor layer 4). With the positive fixed charge, the back channel is formed in the vicinity of the interface with the organic protective film 6 in the crystalline silicon semiconductor layer 4 when the thin-film transistor 10A is turned on.

Accordingly, when the thin-film transistor 10A is turned on, only the front channel formed in the vicinity of the interface toward the gate electrode 2 in the crystalline silicon semiconductor layer 4 is supposed to be an only necessary path. However, since the back channel is formed, as illustrated in FIG. 3B, the current-voltage characteristics of the thin-film transistor 10A are characteristics in which the characteristics of the front channel (the curve illustrated as the drain current in FIG. 3B) and the characteristics of the back channel (the curve illustrated as the parasitic current in FIG. 3B) are overlapped.

When the thin-film transistor 10A is turned on from an off-state, once the thin-film transistor 10A is turned on, the characteristics converges to the same characteristics as the intended characteristics even if the characteristic of the front channel and the characteristic of the back channel overlap. In the region in which the current rises from off to on, the characteristics of the drain current and the characteristics of the parasitic current can be seen overlapped as an inconsistency in comparison to the designed characteristics. This is a possible cause of the variation in the rising regions of the subthreshold swing values.

The inventors made further consideration on the fixed charge in the organic protective film 6, and found out the following.

Although the positive charge is present on the interface of the organic protective film 6, it is assumed that the bulk of the organic protective film 6 is charged with negative fixed charge. Accordingly, if the thickness of the organic protective film 6 increases, the amount of the negative fixed charge increases, which presumably suppresses the positive charge present at the interface of the organic protective film 6.

However, the inventors found out that, if the thickness of the organic protective film 6 is greater than or equal to a certain thickness, the effect of suppressing the positive charge at the interface of the organic protective film 6 does not increase any more. This is because, if the negative fixed charge in the bulk of the organic protective film 6 is present in a region near the interface of the organic protective film 6, the effect of suppressing the positive charge is expected, due to the significant influence of the negative fixed charge. However, if the thickness of the organic protective film 6 is large and the negative fixed charge in the bulk of the organic protective film 6 is away from the interface, it is assumed that the effect of suppressing the positive charge is reduced by an inverse proportion of a square of the distance.

Accordingly, if the thickness of the organic protective film 6 is increased, once the thickness becomes greater than or equal to a constant value, the effect of suppressing the positive charge at the interface of the organic protective film 6 is lost. Consequently, the fixed charge in the entire organic protective film 6 remains as positive. As described above, the polarity of the total charge included in the organic protective film 6 and the total charge at the interface between the organic protective film 6 and the amorphous silicon semiconductor layer 5 is positive.

Here, a thin-film transistor using an inorganic protective film made of an inorganic material as the channel protective film and a thin-film transistor using an organic protective film made of an organic material as the channel protective film are compared. The inventors found out that the threshold voltage was more on the negative side in the thin-film transistor using the organic protective film. Accordingly, more positive charge is present when the organic protective film is used than when the inorganic protective film is used.

Accordingly, if there is a thin-film transistor having a structure in which an intrinsic amorphous silicon semiconductor layer is formed between the channel protective film made of the organic protective film and the crystalline silicon semiconductor layer, the intrinsic amorphous silicon semiconductor layer cannot suppress the effect of the positive charge increased by using the organic protective film. Alternatively, when the intrinsic amorphous silicon semiconductor is not used, a regular amorphous silicon semiconductor layer is usually used regardless of its film quality. In this case, the influence of the positive charge which increases when the organic protective film is not suppressed either. This is because, the amorphous silicon semiconductor layer is generally introduced for suppressing the turn-off current, and the intrinsic amorphous silicon semiconductor layer can sufficiently suppress the turn-off current.

As described above, the intrinsic amorphous silicon semiconductor layer cannot function as the charge suppressing layer. Accordingly, by merely using the amorphous silicon semiconductor layer for the thin-film transistor having the organic protective film as the channel layer cannot suppress the formation of the back channel caused by the organic protective film.

Based on the finding described above, the inventors conceived an idea of providing the amorphous silicon semiconductor layer 5 including the negative carriers of the predetermined charge amount as the charge suppressing layer between the organic protective film 6 and the crystalline silicon semiconductor layer 4, as in the thin-film transistor 10 according to the embodiment. More specifically, in the present disclosure, the influence of the positive charge in the organic protective film 6 is reduced by intentionally using the amorphous silicon semiconductor layer having the DOS indicating the presence of negative carriers; that is, an amorphous silicon semiconductor layer having high defect density with an increased number of traps, which is not typically used.

In this embodiment, the inventors found out that the electric field can be shielded by cancelling the positive charge in the organic protective film 6 by the negative carrier in the amorphous silicon semiconductor layer 5, with the configuration of the amorphous silicon semiconductor layer 5 including the negative carrier of the charge density at least $3 \times 10^{11}$ cm$^{-2}$. With this configuration, as illustrated in FIG. 4A, it is possible to suppress the formation of the back channel when the thin-film transistor is turned on, and as illustrated in FIG. 4B, the parasitic current due to the back channel can be suppressed. As a result, the current-voltage characteristics of the thin-film transistor 10 are achieved by the characteristics of the front channel (the curve illustrated as the drain current in FIG. 4B), and the variation in the rising regions of the subthreshold swing values is suppressed, thereby improving the subthreshold swing value.

Furthermore, with the thin-film transistor 10 according to this embodiment, it is possible to suppress the formation of the back channel. Therefore, it is possible to suppress the shift in the threshold voltage.

As described above, the thin-film transistor 10 according to this embodiment can improve the subthreshold swing value and suppress the shift in the threshold voltage. Accordingly, it is possible to improve the accuracy of the black light-emission region when the thin-film transistor 10 according to this embodiment is used as the driving transistor of the organic EL display.

Figure 5A:
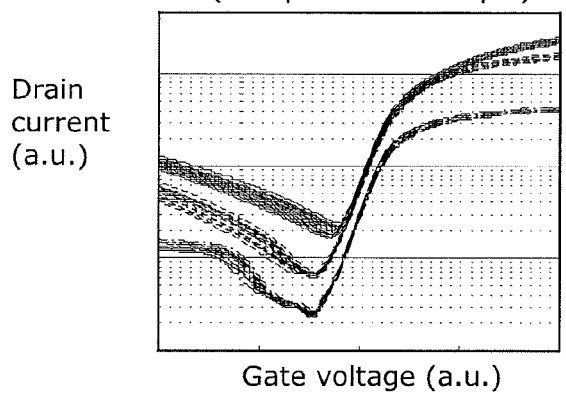
FIG. 5A illustrates current-voltage characteristics of the thin-film transistor according to the comparative example illustrated in FIG. 3A.
Figure 5B:
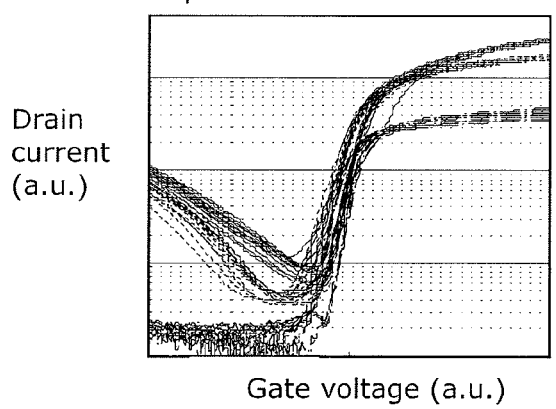
FIG. 5B illustrates the current-voltage characteristics of the thin-film transistor according to the exemplary embodiment illustrated in FIG. 1 (thickness of the amorphous silicon semiconductor layer=10 nm).
Figure 5C:
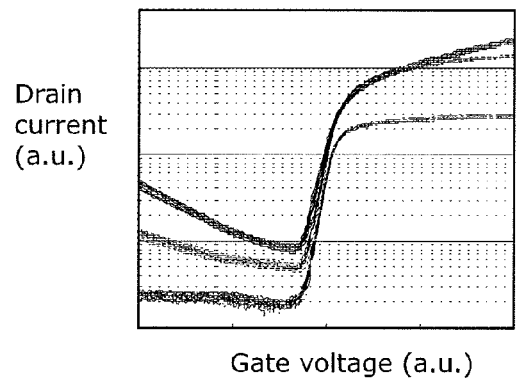
FIG. 5C illustrates the current-voltage characteristics of the thin-film transistor according to the exemplary embodiment illustrated in FIG. 1 (thickness of the amorphous silicon semiconductor layer=20 nm).

The thin-film transistors were actually manufactured and the current-voltage characteristics of the thin-film transistors were measured. The measurement results shall be described with reference to FIG. 5A, FIG. 5B, and FIG. 5C. FIG. 5A illustrates the current-voltage characteristics of the thin-film transistor according to the comparative example illustrated in FIG. 3A. FIG. 5B and FIG. 5C illustrate the current-voltage characteristics of the thin-film transistor according to this embodiment illustrated in FIG. 1. Note that, FIG. 5B illustrates a case in which the thickness of the amorphous silicon semiconductor layer 5 is 10 nm, and FIG. 5C illustrates a case in which the thickness of the amorphous silicon semiconductor layer 5 is 20 nm.

Note that, in the thin-film transistor according to the comparative example having the characteristics illustrated in FIG. 5A, the amorphous silicon semiconductor layer is not formed as described above. In the thin-film transistors according to this embodiment having the characteristics illustrated in FIGS. 5B and 5C, the amorphous silicon semiconductor layers 5 with the same film quality were formed. The DOS of both of the amorphous silicon semiconductor layers 5 was $4.0 \times 10^{11}$ cm$^{-2}$, and the thickness of both of the organic protective films was 500 nm.

As illustrated in FIG. 5A to FIG. 5C, in the thin-film transistor 10 according to the present disclosure has suppressed variation in the rising regions of the subthreshold swing values, compared to the thin-film transistor 10A according to the comparative example, indicating that the subthreshold swing value is improved. Furthermore, as illustrated in FIG. 5B and FIG. 5C, by increasing the thickness of the amorphous silicon semiconductor layer 5, the subthreshold swing value is further improved.

Figure 6:
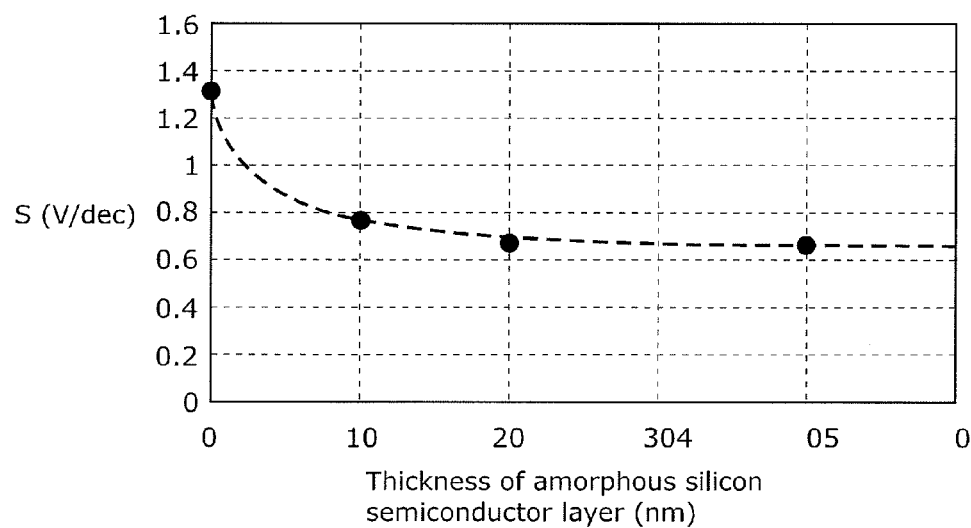
FIG. 6 illustrates a relationship between an amorphous silicon semiconductor layer 5 and the subthreshold swing value in the thin-film transistor according to the exemplary embodiment.

Next, the relationship between the thickness of the amorphous silicon semiconductor layer 5 and the subthreshold swing value shall be described with reference to FIG. 6. FIG. 6 illustrates the relationship between the amorphous silicon semiconductor layer 5 and the subthreshold swing value in the thin-film transistor according to this embodiment. Note that, in FIG. 6, the film quality of the amorphous silicon semiconductor layer 5 is identical (the DOS is constant), and only the thickness was changed for measurement.

As illustrated in FIG. 6, by increasing the thickness of the amorphous silicon semiconductor layer 5, the subthreshold swing value is improved, thereby improving the effect of shielding the electric field. Furthermore, as illustrated in FIG. 6, when the thickness of the amorphous silicon semiconductor layer 5 is greater than or equal to 20 nm, the subthreshold swing value falls within a constant value, indicating that the effect of shielding the electric field is saturated. Note that, if the thickness of the amorphous silicon semiconductor layer 5 is greater than 40 nm, the thickness is so large that the turn-on characteristics are deteriorated. Accordingly, it is preferable that the thickness of the amorphous silicon semiconductor layer 5 is 20 nm to 40 nm.

Figure 7:
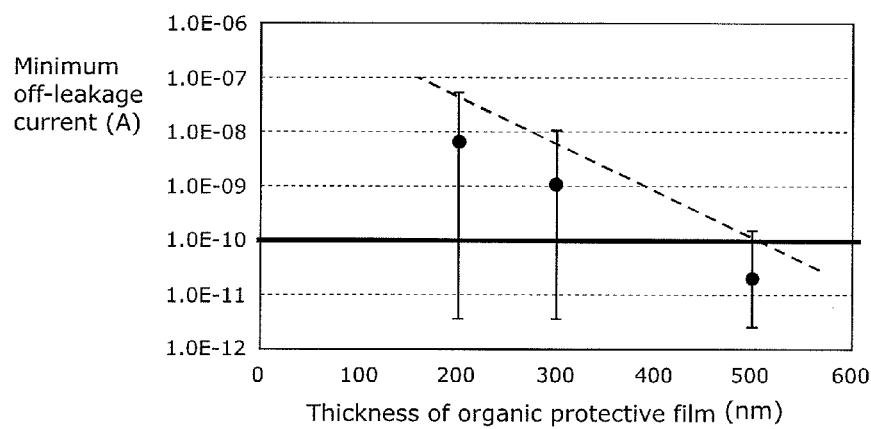
FIG. 7 illustrates a relationship between a thickness of an organic protective film and the minimum off-leakage current in the thin-film transistor according to the exemplary embodiment.

Next, in the thin-film transistor according to this embodiment, the change in the minimum off-leakage current in response to the change in the thickness of the organic protective film 6 shall be illustrated with reference to FIG. 7. FIG. 7 illustrates the relationship between the thickness of the organic protective film and the minimum off-leakage current in the thin-film transistor according to this embodiment. Note that, in FIG. 7, the DOS of the amorphous silicon semiconductor layer 5 is $4.0 \times 10^{11}$ cm$^{-2}$, and the thickness is 20 nm.

In consideration with the reliability of the thin-film transistor as a device, the minimum off-leakage current must be 0.1 nA ($1.0 \times 10^{-11}$ A). Accordingly, as illustrated in FIG. 7, the thickness of the organic protective film 6 is preferably at least 500 nm. When the thickness of the organic protective film 6 is smaller than 500 nm, the off-leakage current when the thin-film transistor is turned off increases due to the damage on the channel layer caused by the etching process. Accordingly, by having the thickness of the organic protective film 6 at least 500 nm, it is possible to suppress the off-leakage current when the thin-film transistor is turned off to a desired level, allowing an implementation of a highly reliable thin-film transistor.

(Method for Manufacturing Thin-Film Transistor)

The following shall describe a method for manufacturing the thin-film transistor 10 according to this embodiment with reference to FIGS. 8A to 8G. FIG. 8A to FIG. 8G are cross-sectional views schematically illustrating the process in the method for manufacturing the thin-film transistor according to this embodiment.

Figure 8A:
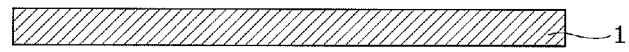
FIG. 8A is a cross-sectional view schematically illustrating a substrate preparation process in a method for manufacturing the thin-film transistor according to the exemplary embodiment.

First, as illustrated in FIG. 8A, the substrate 1 is prepared. As the substrate 1, a glass substrate may be used, for example. After that, an undercoat layer made of a silicon oxide film or a silicon nitride film may be formed on the substrate 1 by the plasma CVD or others, before the gate electrode 2 is formed.

Figure 8B:
FIG. 8B is a cross-sectional view schematically illustrating a gate electrode forming process in the method for manufacturing the thin-film transistor according to the exemplary embodiment.

Next, as illustrated in FIG. 8B, the gate electrode 2 in a predetermined shape is formed above the substrate 1 by patterning. For example, the gate electrodes 2 in the predetermined shape is formed by forming a gate metal film made of molybdenum-tungsten (MoW) on an entire surface above the substrate 1 through sputtering, and by patterning a gate metal film using the photolithography and the wet etching.

Figure 8C:
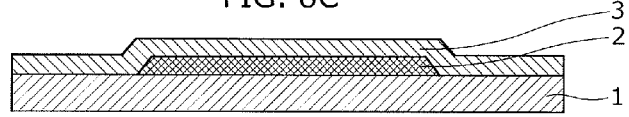
FIG. 8C is a cross-sectional view schematically illustrating a gate insulating film forming process in the method for manufacturing the thin-film transistor according to the exemplary embodiment.

Next, as illustrated in FIG. 8C, the gate insulating film 3 is formed above the substrate 1. For example, the gate insulating film 3 made of an insulating film such as silicon oxide is formed on the entire surface above the substrate 1 by the plasma CVD or others so as to cover the gate electrode 2.

Figure 8D:
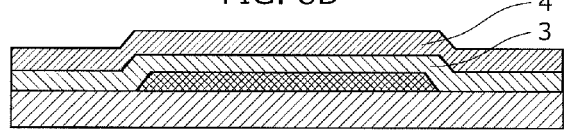
FIG. 8D is a cross-sectional view schematically illustrating a crystalline silicon semiconductor forming process in the method for manufacturing the thin-film transistor according to the exemplary embodiment.

Next, as illustrated in FIG. 8D, the crystalline silicon semiconductor layer 4 is formed on the gate insulating film 3. In this case, first, an amorphous silicon thin film made of an amorphous silicon film (a-Si) is formed on the gate insulating film 3 by the plasma CVD or others. The amorphous silicon film is formed in a predetermined film-forming condition, by introducing silane gas ($SiH_4$) and hydrogen gas ($H_2$) in a predetermined ratio of concentration, for example. Subsequently, a dehydrogenation annealing is performed, and the amorphous silicon thin film is annealed in the predetermined temperature so as to crystallize the amorphous silicon thin film. With this, the crystalline silicon semiconductor layer 4 is formed on the gate insulating film 3.

Note that, in this embodiment, the amorphous silicon thin film is annealed by the laser annealing, which involves irradiating the amorphous silicon thin-film with a laser beam. As the laser annealing, laser annealing using an excimer laser (ELA), laser annealing using a pulse laser, or laser annealing using a continuous wave laser (CW laser) may be used. In addition to the laser annealing, the crystalline silicon semiconductor layer 4 may be formed by crystallization using the rapid thermal annealing (RTA) or by directly growing crystals by the CVD.

Figure 8E:
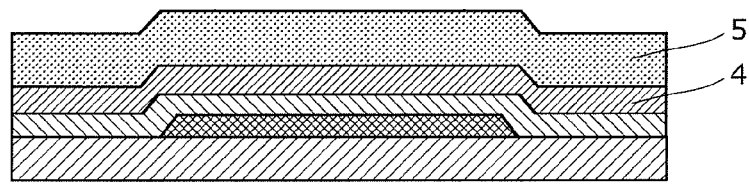
FIG. 8E is a cross-sectional view schematically illustrating an amorphous silicon semiconductor layer forming process in the method for manufacturing the thin-film transistor according to the exemplary embodiment.

Next, as illustrated in FIG. 8E, the amorphous silicon semiconductor layer 5 is formed on the crystalline silicon semiconductor layer 4. For example, an amorphous silicon film is formed as the amorphous silicon semiconductor layer 5. The amorphous silicon film is formed in a predetermined film-forming condition by the plasma CVD or others, using predetermined source gas. For example, the amorphous silicon layer 5 is formed by introducing the silane gas ($SiH_4$) and hydrogen gas ($H_2$) in a predetermined ratio of concentration.

In this embodiment, the amorphous silicon semiconductor layer 5 is preferably formed in a film-forming condition which includes a plasma density of 0.1 to 1.0 [$W/cm^2$], and a growth temperature of 300 to 400° C. As the source gas for the amorphous silicon semiconductor layer 5, gas including silane gas ($SiH_4$), disilane gas ($Si_2H_6$), or trisilane gas ($Si_3H_8$) may be used. As an inert gas introduced with the source gas, other than the hydrogen gas ($H_2$), argon gas (Ar) or helium gas (He) may be used.

Figure 8F:
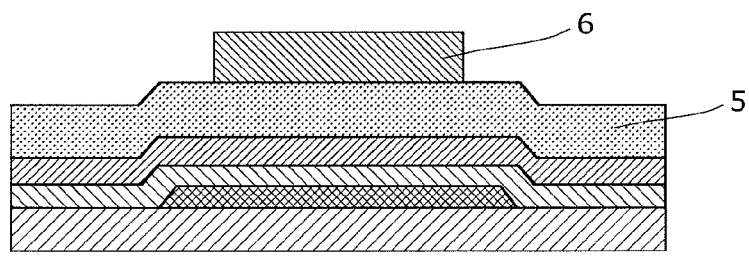
FIG. 8F is a cross-sectional view schematically illustrating an organic protective film forming process in the method for manufacturing the thin-film transistor according to the exemplary embodiment.

Next, as illustrated in FIG. 8F, the organic protective film 6 is formed on the amorphous silicon semiconductor layer 5. For example, the predetermined organic material is applied on the amorphous silicon semiconductor layer 5 by a predetermined application method, and the organic protective film 6 is formed by baking the organic material.

In this embodiment, polysiloxane is applied on the amorphous silicon semiconductor layer 5 first, and the spin coating is performed. With this, the organic protective film 6 is formed on the entire surface of the amorphous silicon semiconductor layer 5. Subsequently, the organic protective film 6 is pre-baked. After that, the organic protective film 6 in the predetermined shape is formed by exposure and development using a photo mask. After that, post-baking on the organic protective film 6 is performed. With this, the organic protective film 6 which functions as the channel protective layer is formed.

Figure 8G:
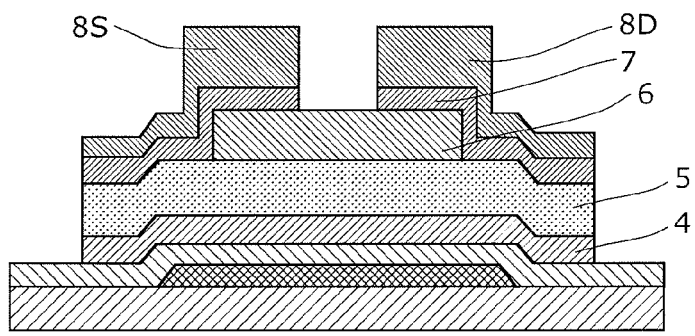
FIG. 8G is a cross-sectional view schematically illustrating a contact layer forming process and a source/drain electrode forming process in the method for manufacturing the thin-film transistor according to the exemplary embodiment.

Next, as illustrated in FIG. 8G, the pair of contact layers 7 is formed on the amorphous silicon semiconductor layer 5, interposing the organic protective film 6. Subsequently, the source electrode 8S and the drain electrode 8D are formed on the pair of the contact layers 7.

In this case, first, an amorphous silicon film doped with an impurity of pentavalent element such as phosphorous (P) is formed on the amorphous silicon semiconductor layer 5 by the plasma CVD as a film for forming the contact layer 7 covering the organic protective film 6. After that, a source-drain metal film for forming the source electrode 8S and the drain electrode 8D is formed on the film for the contract layer 7 by sputtering. Subsequently, a resist having a predetermined shape is patterned on the source-drain metal film for forming the source electrode 8S and the drain electrode 8D in the predetermined shape, and the source-drain metal film is patterned by performing wet etching using the resist as a mask. With this, as illustrated in FIG. 8G, the source electrode 8S and the drain electrode 8D in the predetermined shape are formed. Here, note that the film for the contact layer functions as an etching stopper.

Subsequently, the resist on the source electrode 8S and the drain electrode 8D is removed, and etching such as dry etching is performed using the source electrode 8S and the drain electrode 8D as masks so as to pattern the film for the contract layer. At the same time, the amorphous silicon semiconductor layer 5 and the crystalline silicon semiconductor layer 4 are patterned into an island shape. Accordingly, as illustrated in FIG. 8G, the pair of contact layer 7 in the predetermined shape is formed, and the amorphous silicon semiconductor layer 5 and the crystalline silicon semiconductor layer 4 patterned into the island shape are formed.

The thin-film transistor 10 according to this embodiment is manufactured as described above. Note that, in this embodiment, the amorphous silicon semiconductor 5 having a thickness of 20 nm and DOS of $4.0 \times 10^{11}$ $cm^{-2}$ was formed under a film-forming condition in which the growth temperature is 320° C., the pressure is 2 Torr, an RF power is 50 W (a power density of 0.137 $W/cm^2$) and gas flow rates of silane and hydrogen are 10 sccm and 50 sccm, respectively.

Figure 9:
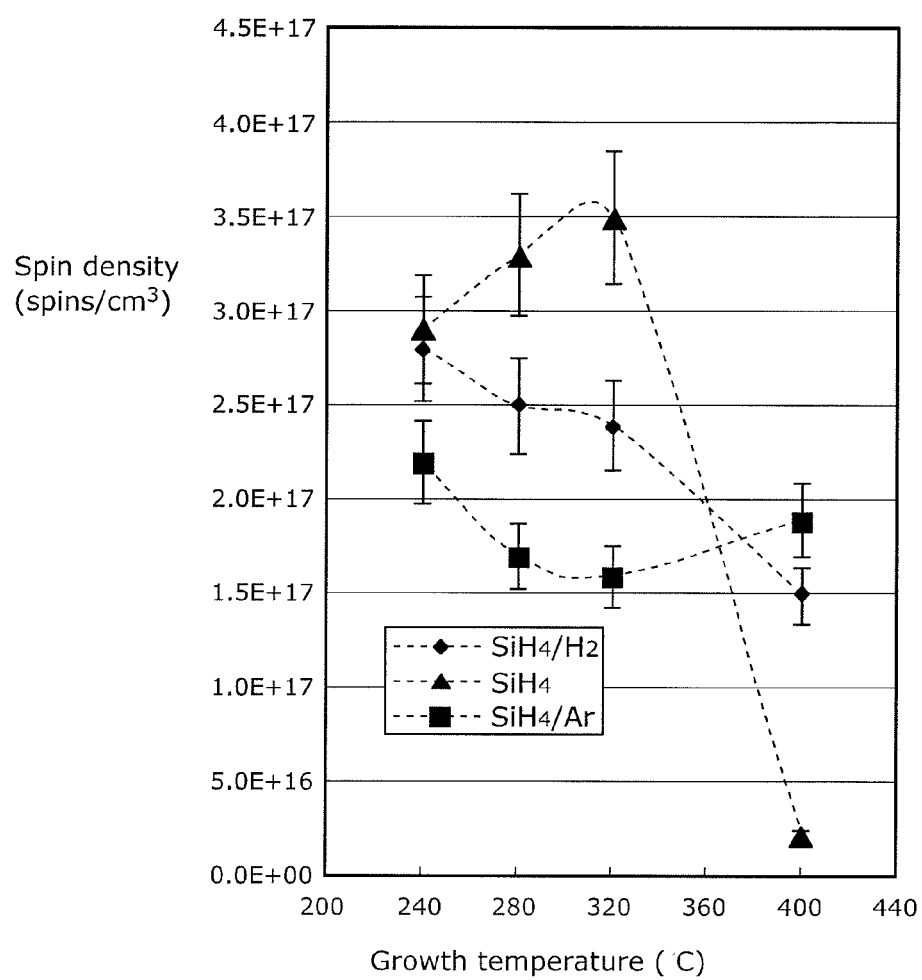
FIG. 9 illustrates a relationship between growth temperatures and spin density when forming the amorphous silicon semiconductor layer 5 by the method for manufacturing the thin-film transistor according to the exemplary embodiment.

Note that, in this embodiment, the growth temperature when forming the amorphous silicon semiconductor layer 5 is preferably 300° C. to 400° C. This point shall be described with reference to FIG. 9. FIG. 9 is a chart illustrating the relationship between the growth temperature and the spin density when forming the amorphous silicon semiconductor layer 5 in the method for manufacturing the thin-film transistor according to this embodiment. Note that, the vertical axis in FIG. 9 represents a spin density calculated by the electron spin resonance (ESR). The spin density has a correlation with the defect density (dangling bond); that is, the DOS. FIG. 9 illustrates cases in which the amorphous silicon semiconductor layer 5 is formed using $SiH_4$ and $H_2$, using $SiH_4$, and using $SiH_4$ and Ar.

FIG. 9 shows that the amorphous silicon semiconductor layer 5 having the film quality represented by the spin density of $1.0 \times 10^{17}$ $cm^{-3}$ to $4 \times 10^{17}$ $cm^{-3}$. FIG. 9 also shows that the growth temperature when the amorphous silicon semiconductor layer 5 is formed is preferably approximately 300° C. to 400° C.

Note that, when the amorphous silicon film was formed under a condition in which the growth temperature is 350° C.

and the plasma density is 0.01 to 0.06 [W/cm$^2$] (without dehydrogenation), the spin density was approximately $4\times10^{16}$ cm$^{-3}$ to $6\times10^{16}$ cm$^{-3}$. Another amorphous silicon film was formed under the same condition and with a dehydrogenation at 500° C. for 20 minutes. The spin density of this amorphous silicon film was $3\times10^{18}$ cm$^{-3}$ to $5\times10^{18}$ cm$^{-3}$. To put it differently, in this embodiment, the amorphous silicon semiconductor film 5 having the film quality represented by the spin density of $1.0\times10^{17}$ cm$^{-3}$ to $4\times10^{17}$ cm$^{-3}$ is formed as described above. Accordingly, the amorphous silicon semiconductor layer 5 in a level different from a general film quality (DOS) is used.

Although the thin-film transistor and the method for manufacturing the thin-film transistor according to the present disclosure have been described based on this embodiment above, the present disclosure is not limited to this embodiment described above.

For example, the thin-film transistor according to this embodiment may be used as a display device such as an organic EL display device, a liquid crystal display device, and others. In addition, the display device may be used as a flat-panel display, and may be applicable to electronic devices such as television sets, personal computers, or mobile phones.

Those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The thin-film transistor according to the present disclosure is widely applicable to display devices such as television sets, personal computers, and mobile phones, or various electronic devices having thin-film transistors.

The invention claimed is:

1. A thin-film transistor comprising:
a substrate;
a gate electrode above the substrate;
a gate insulating film above the gate electrode;
a crystalline silicon semiconductor layer above the gate insulating film;
an amorphous silicon semiconductor layer above the crystalline silicon semiconductor layer;
an organic protective film comprising an organic material and above the amorphous silicon semiconductor layer, the organic protective film containing a positive fixed charge; and
a source electrode and a drain electrode above the amorphous silicon semiconductor layer interposing the organic protective film,
wherein a thickness of the amorphous silicon semiconductor layer is at least 10 nm and at most 60 nm,
a charge density of the amorphous silicon semiconductor layer is at least $1\times10^{17}$ cm$^{-3}$ and at most $7\times10^{17}$ cm$^{-3}$, when measured by transition voltage spectroscopy, the charge density being of a negative charge.

2. The thin-film transistor according to claim 1,
wherein a thickness of the organic protective film in a region overlapping with the source electrode or the drain electrode is at least 300 nm and at most 1 μm.

3. The thin-film transistor according to claim 1,
wherein a thickness of the organic protective film in a region overlapping with the source electrode or the drain electrode is at least 500 nm and at most 1 μm.

4. The thin-film transistor according to claim 1,
wherein a polarity of a total charge of a fixed charge included in the organic protective film and charge at an interface between the organic protective film and the amorphous silicon semiconductor layer is positive.

5. The thin-film transistor according to claim 1,
wherein the thickness of the amorphous silicon semiconductor layer is at least 20 nm and at most 40 nm, and the charge density of the amorphous silicon semiconductor layer is at least $1\times10^{17}$ cm$^{-3}$ and at most $5\times10^{17}$ cm$^{-3}$.

6. A method for manufacturing a thin-film transistor, the method comprising:
preparing a substrate;
forming a gate electrode above the substrate;
forming a gate insulating film above the gate electrode;
forming a crystalline silicon semiconductor layer above the gate insulating film;
forming an amorphous silicon semiconductor layer above the crystalline silicon semiconductor layer;
forming, an organic protective film by applying an organic material on the amorphous silicon semiconductor layer, the organic protective film containing a positive fixed charge; and
forming a source electrode and a drain electrode above the amorphous silicon semiconductor layer interposing the organic protective film,
wherein a thickness of the amorphous silicon semiconductor layer is at least 10 nm and at most 60 nm, and
a charge density of the amorphous silicon semiconductor layer is at least $1\times10^{17}$ cm$^{-3}$ and at most $7\times10^{17}$ cm$^{-3}$, when measured by transition voltage spectroscopy, the charge density being of a negative charge.

7. The method for manufacturing the thin-film transistor according to claim 6,
wherein the amorphous silicon semiconductor layer is formed using a source gas including one of silane gas, disilane gas, and trisilane gas, and an inert gas including one of argon, hydrogen, and helium, under a condition in which a plasma density is in the range of approximately 0.1 W/cm$^2$ to approximately 1 W/cm$^2$.

8. The method for manufacturing the thin-film transistor according to claim 6,
wherein the amorphous silicon semiconductor layer is formed under a condition in which a growth temperature is in the range of approximately 300° C. to approximately 400° C.

9. The thin-film transistor according to claim 1,
the negative charge in the amorphous silicon semiconductor layer has a charge density of at least $3\times10^{11}$ cm$^{-2}$.

10. The thin-film transistor according to claim 1,
the positive fixed charge in the organic protective film has a charge density of at least $5\times10^{11}$ cm$^{-2}$.

11. The thin-film transistor according to claim 1,
the amorphous silicon semiconductor layer is a charge suppressing layered configured to suppress the positive fixed charge contained in the organic protective film.

12. The thin-film transistor according to claim 1,
the charge density of the amorphous silicon semiconductor layer is a density of state of the amorphous silicon semiconductor layer.

* * * * *